(12) United States Patent  (10) Patent No.: US 11,880,042 B2
Masuda et al.  (45) Date of Patent: Jan. 23, 2024

(54) DETACHABLE PROJECTION DEVICE, SEALING HOUSING THEREOF, AND WEARABLE APPRATUS

(71) Applicant: MEGAFORCE COMPANY LIMITED, New Taipei (TW)

(72) Inventors: Makoto Masuda, New Taipei (TW); Han-Chiang Wu, New Taipei (TW); Nobuhiro Shirai, New Taipei (TW)

(73) Assignee: MEGAFORCE COMPANY LIMITED, New Taipei (TW)

( * ) Notice: Subject to any disclaimer, the term of this patent is extended or adjusted under 35 U.S.C. 154(b) by 0 days.

(21) Appl. No.: 18/147,673

(22) Filed: Dec. 28, 2022

(65) Prior Publication Data

US 2023/0213774 A1 Jul. 6, 2023

Related U.S. Application Data

(60) Provisional application No. 63/296,665, filed on Jan. 5, 2022.

(30) Foreign Application Priority Data

Nov. 23, 2022 (TW) ................................. 111212843

(51) Int. Cl.
*G02B 27/01* (2006.01)
*G06F 1/16* (2006.01)
*H05K 5/06* (2006.01)

(52) U.S. Cl.
CPC ..... *G02B 27/0176* (2013.01); *G02B 27/0172* (2013.01); *G06F 1/163* (2013.01); *G06F 1/1656* (2013.01); *H05K 5/061* (2013.01)

(58) Field of Classification Search
CPC ............ G02B 27/0176; G02B 27/0172; G02B 27/017; G02B 2027/0156; G02B 2027/0178; G06F 1/163; G06F 1/1656; H05K 5/061
See application file for complete search history.

(56) References Cited

U.S. PATENT DOCUMENTS

2021/0154558 A1* 5/2021 Travers .............. A63B 71/0622

FOREIGN PATENT DOCUMENTS

WO WO2022104346 * 5/2022 ............. G02B 27/09

* cited by examiner

*Primary Examiner* — Mihir K Rayan
(74) *Attorney, Agent, or Firm* — Li & Cai Intellectual Property Office

(57) ABSTRACT

A detachable projection device, a sealing housing thereof, and a wearable apparatus are provided. The sealing housing includes a first cover, a second cover, a first waterproof and dustproof gasket having an enclosed loop-shape, and a transparent case. The first cover and the second cover respectively have two sealing edge portions corresponding in shape to each other. The second cover is detachably fastened to the first cover, and the first waterproof and dustproof gasket is gaplessly sandwiched between and abutted against the two sealing edge portions, so that the first cover, the second cover, and the first waterproof and dustproof gasket jointly define an accommodating space. The transparent case is connected to the second cover and has an insertion slot that is in spatial communication with an optical area of the accommodating space.

15 Claims, 12 Drawing Sheets

DETACHABLE PROJECTION DEVICE, SEALING HOUSING THEREOF, AND WEARABLE APPRATUS

CROSS-REFERENCE TO RELATED PATENT APPLICATION

This application claims the benefit of priority to Taiwan Patent Application No. 111212843, filed on Nov. 23, 2022. The entire content of the above identified application is incorporated herein by reference.

This application claims the benefit of priority to the U.S. Provisional Patent Application Ser. No. 63/296,665 filed on Jan. 5, 2022, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a projection device, and more particularly to a detachable projection device, a sealing housing thereof, and a wearable apparatus.

BACKGROUND OF THE DISCLOSURE

In order to possess a waterproof and dustproof function, a projection device applied in a conventional wearable apparatus is provided with an undetachable sealed housing (e.g., a housing is sealed by an adhesive), such that an optical engine of the conventional wearable apparatus is difficult to be replaced or repaired, causing the costs associated with the conventional wearable apparatus to be too high to allow for widespread popularization.

SUMMARY OF THE DISCLOSURE

In response to the above-referenced technical inadequacies, the present disclosure provides a detachable projection device, a sealing housing thereof, and a wearable apparatus to effectively improve on the issues associated with conventional projection devices.

In one aspect, the present disclosure provides a wearable apparatus, which includes a detachable projection device and a wearable device. The detachable projection device includes a sealing housing, an optical engine, a light-guide optical element (LOE), and a circuit board. The sealing housing includes a first cover, a second cover, a first waterproof and dustproof gasket, and a transparent case. The first cover has a first sealing edge portion. The second cover has a second sealing edge portion corresponding in shape to the first sealing edge portion. The first waterproof and dustproof gasket has an enclosed loop-shape. The second cover is detachably fastened to the first cover, and the first waterproof and dustproof gasket is gaplessly sandwiched between and abutted against the first sealing edge portion and the second sealing edge portion, so that the first cover, the second cover, and the first waterproof and dustproof gasket jointly define an accommodating space having an optical area and a circuit area. The transparent case is detachably assembled to the second cover and has an insertion slot that is in spatial communication with the optical area of the accommodating space. The optical engine is detachably fastened to the first cover and is located in the optical area of the accommodating space. The optical engine includes a light source module and an image formation module that is optically coupled to the light source. The LOE is assembled to the image formation module and is inserted into the insertion slot of the transparent case. The circuit board is located in the circuit area of the accommodating space and is electrically coupled to the optical engine. The wearable device has a battery arranged therein. The detachable projection device is detachably fastened to the wearable device and is electrically coupled to the battery.

In another aspect, the present disclosure provides a detachable projection device, which includes a sealing housing, an optical engine, a light-guide optical element (LOE), and a circuit board. The sealing housing includes a first cover, a second cover, a first waterproof and dustproof gasket, and a transparent case. The first cover has a first sealing edge portion. The second cover has a second sealing edge portion corresponding in shape to the first sealing edge portion. The first waterproof and dustproof gasket has an enclosed loop-shape. The second cover is detachably fastened to the first cover, and the first waterproof and dustproof gasket is gaplessly sandwiched between and abutted against the first sealing edge portion and the second sealing edge portion, so that the first cover, the second cover, and the first waterproof and dustproof gasket jointly define an accommodating space having an optical area and a circuit area. The transparent case is detachably assembled to the second cover and has an insertion slot that is in spatial communication with the optical area of the accommodating space. The optical engine is detachably fastened to the first cover and is located in the optical area of the accommodating space. The optical engine includes a light source module and an image formation module that is optically coupled to the light source. The LOE is assembled to the image formation module and is inserted into the insertion slot of the transparent case. The circuit board is located in the circuit area of the accommodating space and is electrically coupled to the optical engine.

In yet another aspect, the present disclosure provides a sealing housing, which includes a first cover, a second cover, a first waterproof and dustproof gasket, and a transparent case. The first cover has a first sealing edge portion. The second cover has a second sealing edge portion corresponding in shape to the first sealing edge portion. The first waterproof and dustproof gasket has an enclosed loop-shape. The second cover is detachably fastened to the first cover, and the first waterproof and dustproof gasket is gaplessly abutted against and sandwiched between the first sealing edge portion and the second sealing edge portion, so that the first cover, the second cover, and the first waterproof and dustproof gasket jointly define an accommodating space having an optical area and a circuit area. The transparent case is detachably assembled to the second cover and has an insertion slot that is in spatial communication with the optical area of the accommodating space.

Therefore, through the structural arrangement of the sealing housing (of the detachable projection device or the wearable apparatus) provided by the present disclosure, the components in the sealing housing can be easily detached to be replaced or repaired under the premise of meeting a waterproof and dustproof requirement, thereby effectively reducing cost of the detachable projection device and facilitating the detachable projection device to be popularized.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
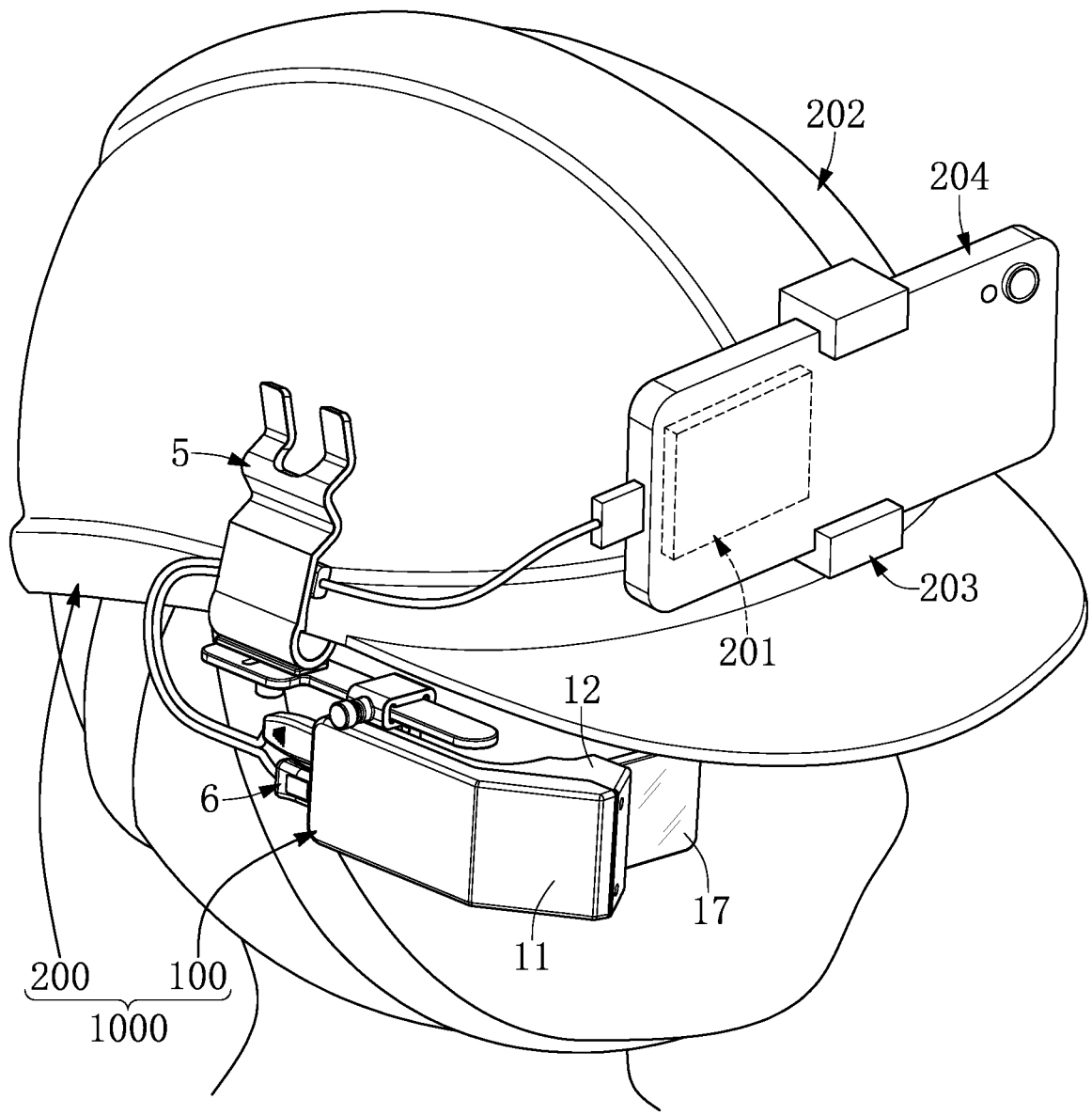
FIG. 1 is a schematic usage view of a wearable apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
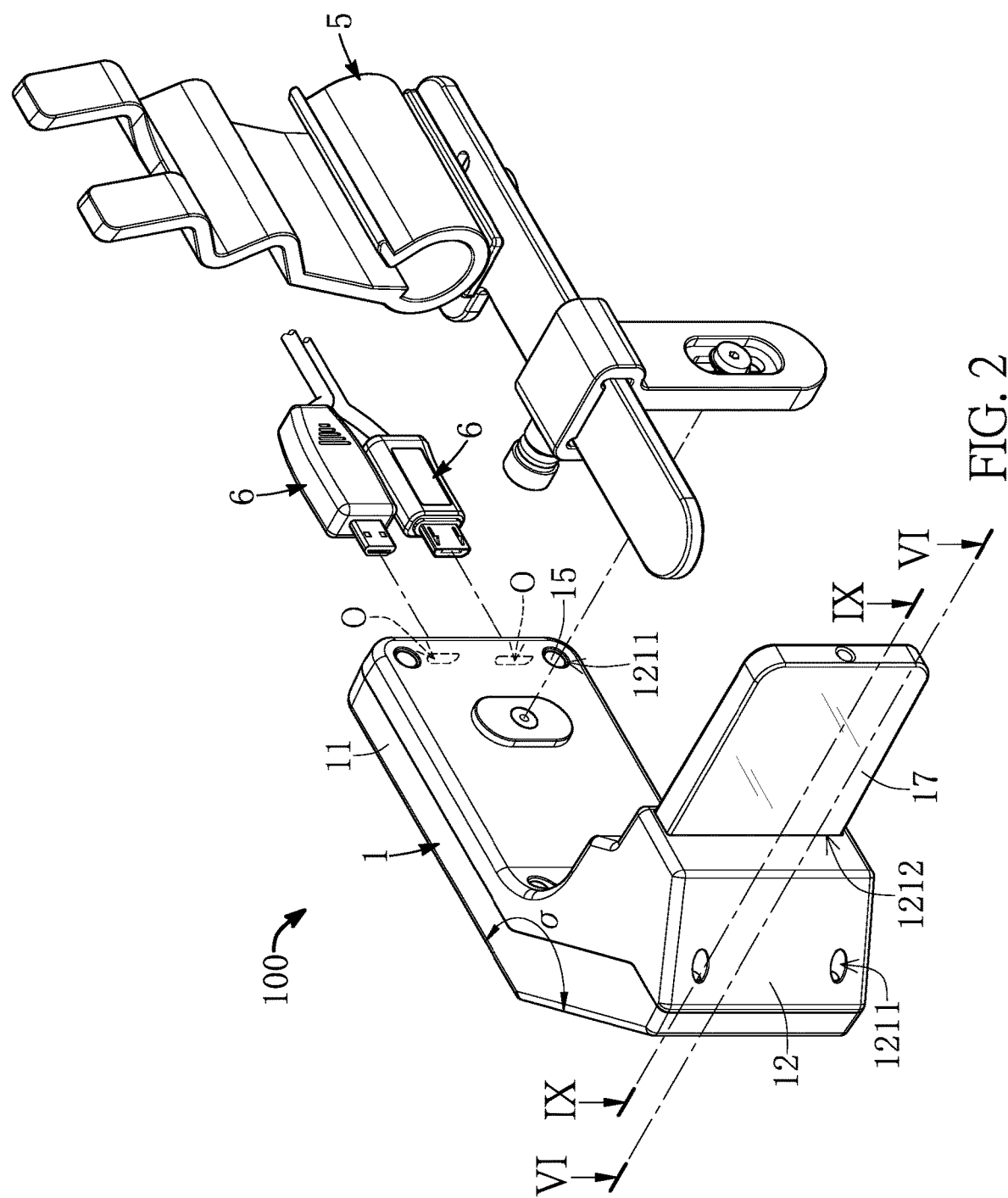
FIG. 2 is an exploded view of a detachable projection device of FIG. 1.
Figure 3:
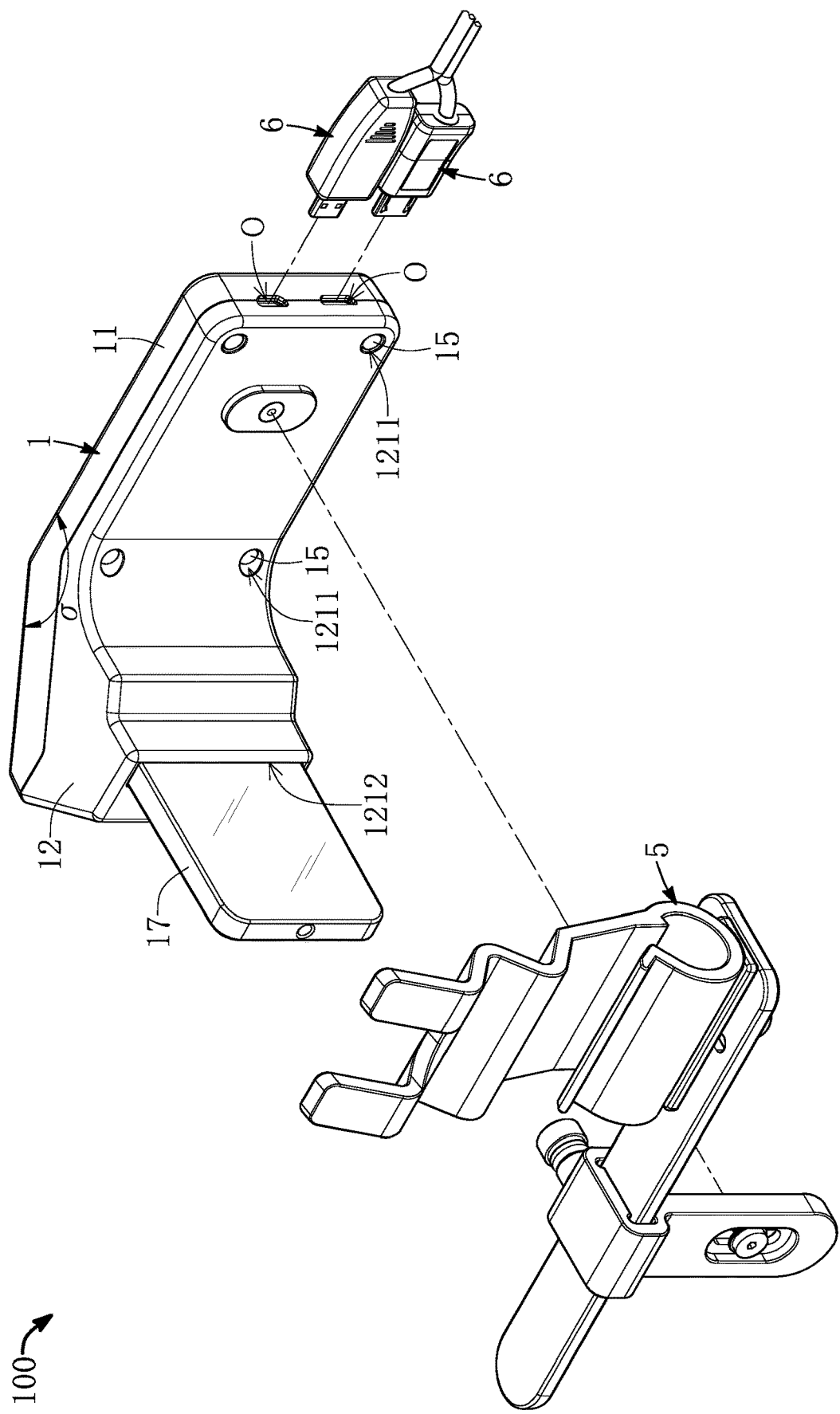
FIG. 3 is an exploded view of the detachable projection device of FIG. 1 from another angle of view.

Referring to FIG. 1 to FIG. 10, a first embodiment of the present disclosure is provided. As shown in FIG. 1 to FIG. 3, the present embodiment provides a wearable apparatus 1000 including a detachable projection device 100 and a wearable device 200. The detachable projection device 100 can be an augmented reality (AR) device, and the detachable projection device 100 is detachably fastened to the wearable device 200 and is electrically coupled to a battery 201 arranged in the wearable device 200, but the present disclosure is not limited thereto.

It should be noted that the detachable projection device 100 of the wearable apparatus 1000 in the present embodiment is described in cooperation with the wearable device 200, but the present disclosure is not limited thereto. For example, in other embodiments of the present disclosure not shown in the drawings, the detachable projection device 100 can be independently used (e.g., sold) or can be used in cooperation with other devices.

Figure 4:
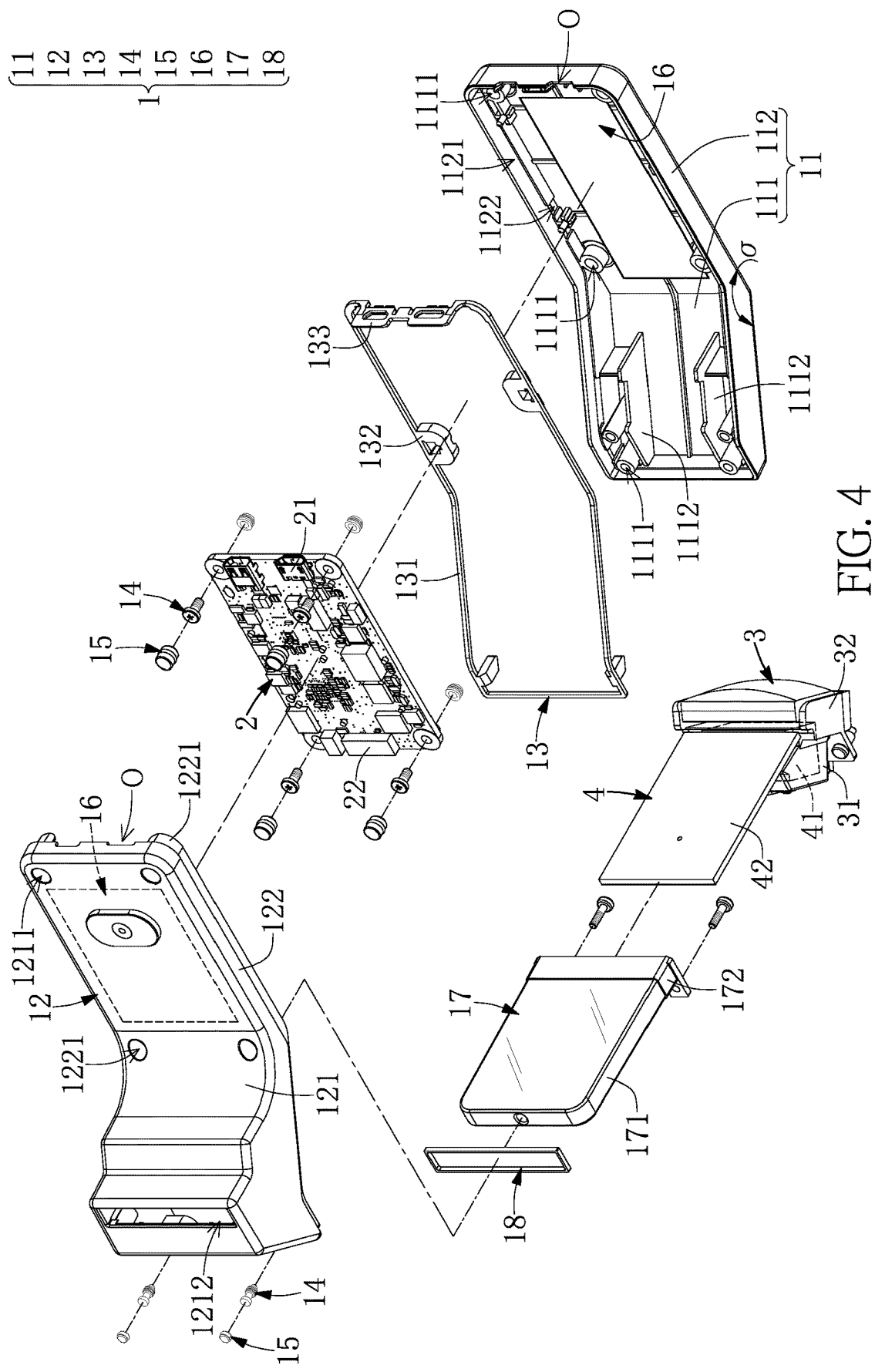
FIG. 4 is an exploded view showing the detachable projection device of FIG. 1 when a movable frame and a cable connector are omitted.
Figure 5:
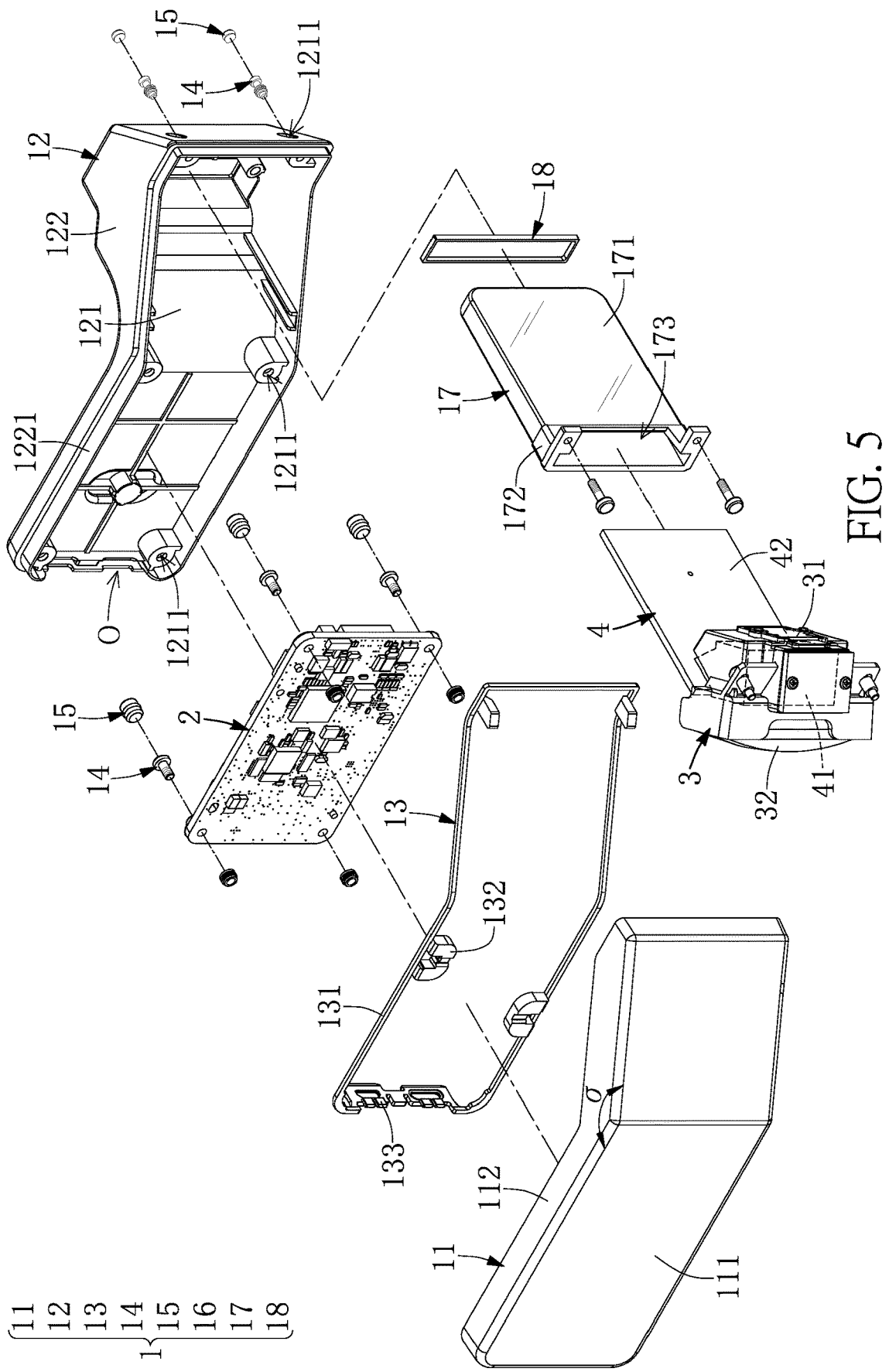
FIG. 5 is an exploded view showing the detachable projection device of FIG. 1 when the movable frame and the cable connector are omitted from another angle of view.
Figure 6:
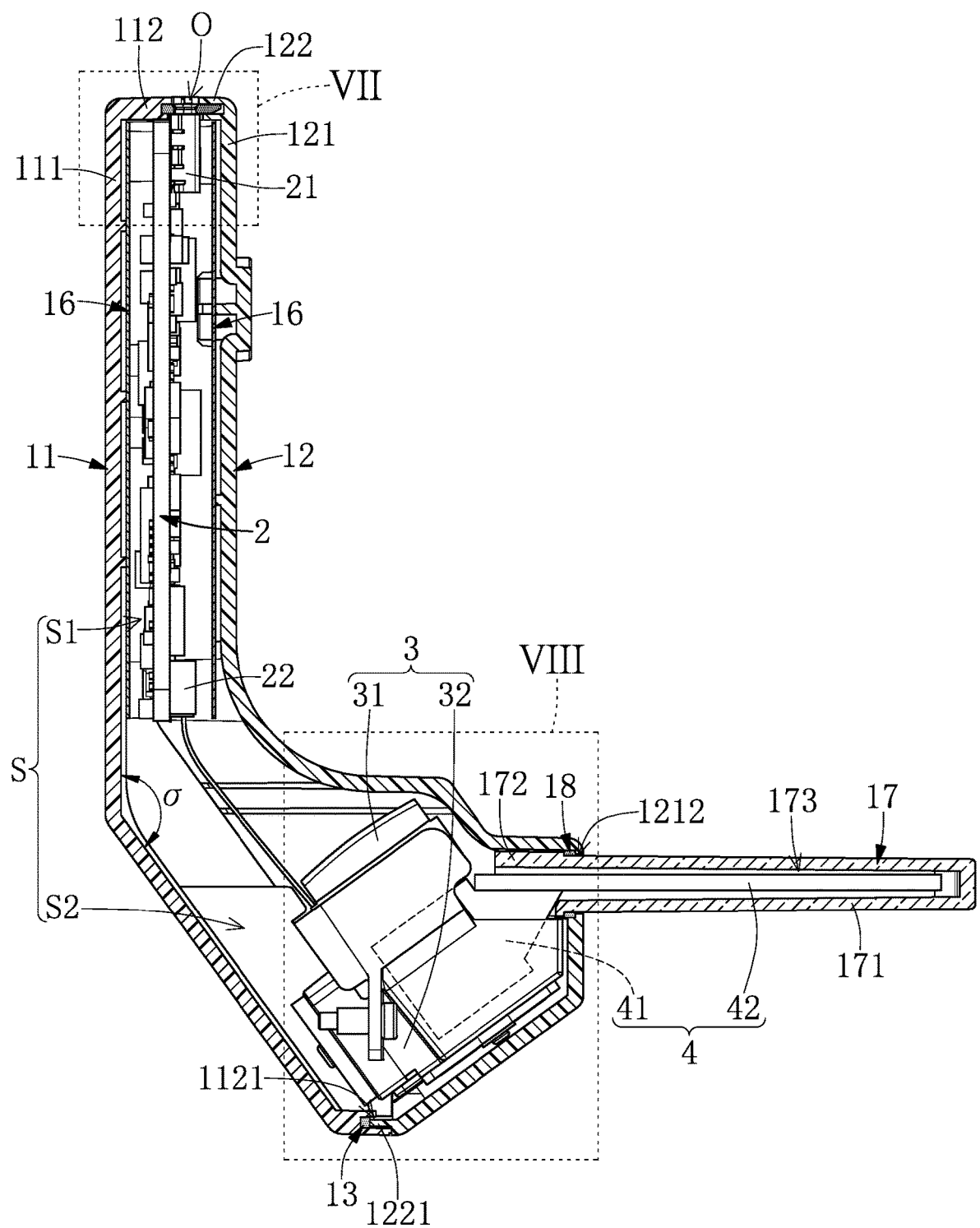
FIG. 6 is a cross-sectional view taken along line VI-VI of FIG. 2.

The following description describes the structure and connection relationship of each of the detachable projection device 100 and the wearable device 200. As shown in FIG. 4 to FIG. 6 of the present embodiment, the detachable projection device 100 includes a sealing housing 1, a circuit board 2, an optical engine 3, and a light-guide optical element (LOE) 4.

The sealing housing 1 is a detachable structure and includes a first cover 11, a second cover 12 assembled to the first cover 11, a first waterproof and dustproof gasket 13 sandwiched between the first cover 11 and the second cover 12, a plurality of fasteners 14 (e.g., screws) assembled to the first cover 11 and the second cover 12, a plurality of waterproof and dustproof plungers 15 respectively corresponding in position to the fasteners 14, two electromagnetic interference (EMI) layers 16 respectively corresponding in position to the first cover 11 and the second cover 12, a transparent case 17 assembled to the second cover 12, and a second waterproof and dustproof gasket 18 that is sandwiched between the second cover 12 and the transparent case 17.

Each of the first cover 11 and the second cover 12 is integrally formed as a single one-piece structure, and the first cover 11 has a first main body 111 and a first sealing edge portion 112 that is connected to and surrounds the first main body 111. Moreover, the second cover 12 has a second main body 121 and a second sealing edge portion 122 that is connected to and surrounds the second main body 121, and the second sealing edge portion 122 corresponds in shape to the first sealing edge portion 112.

Specifically, the second cover 12 is assembled to an inner side of the first cover 11, and the first main body 111 (or the first cover 11) has a plurality of fixing slots 1111 and an assembling seat 1112, which are formed on an inner surface thereof. The second main body 121 (or the second cover 12) has a plurality of fixing holes 1211 respectively corresponding in position to the fixing slots 1111 and a thru-hole 1212 that corresponds in position to (e.g., faces toward) the assembling seat 1112.

Figure 7:
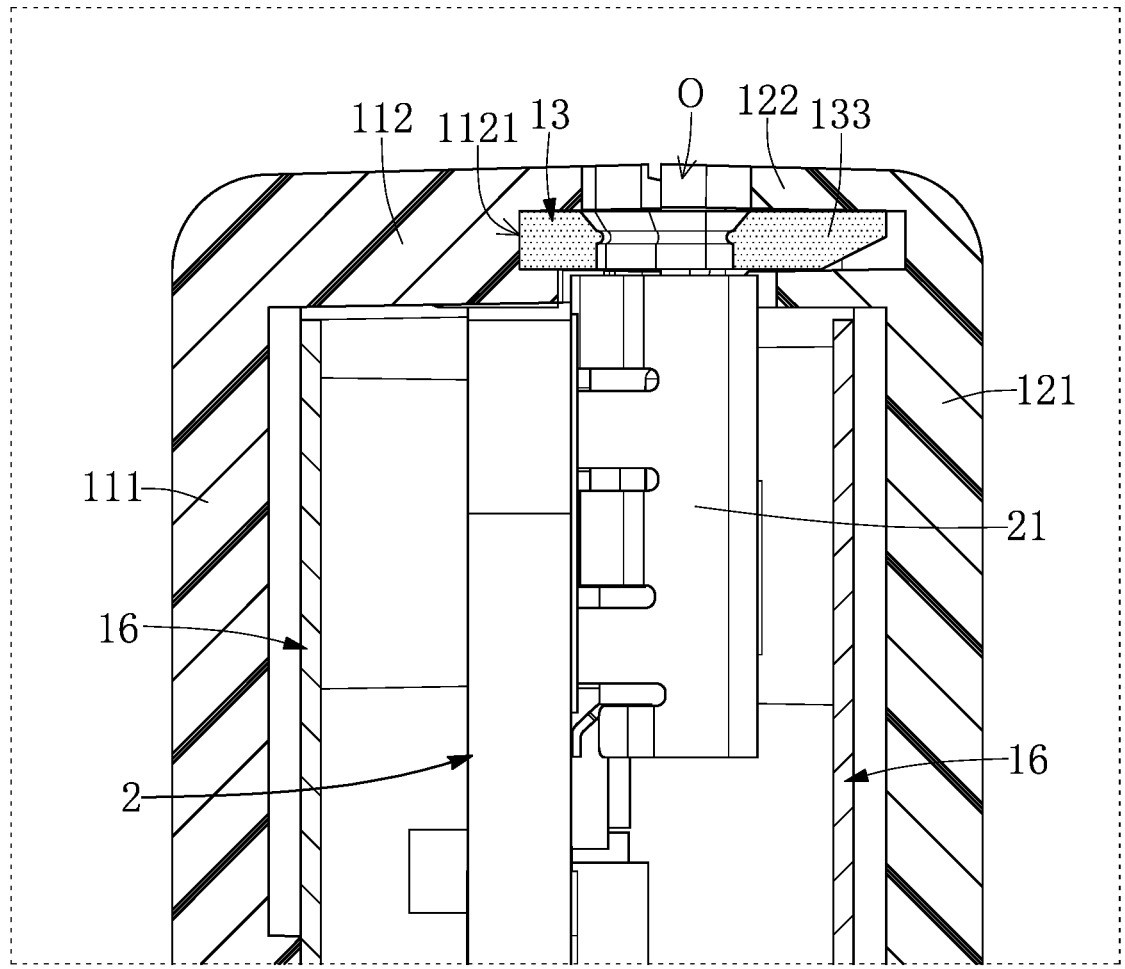
FIG. 7 is an enlarged view of part VII of FIG. 6.
Figure 8:
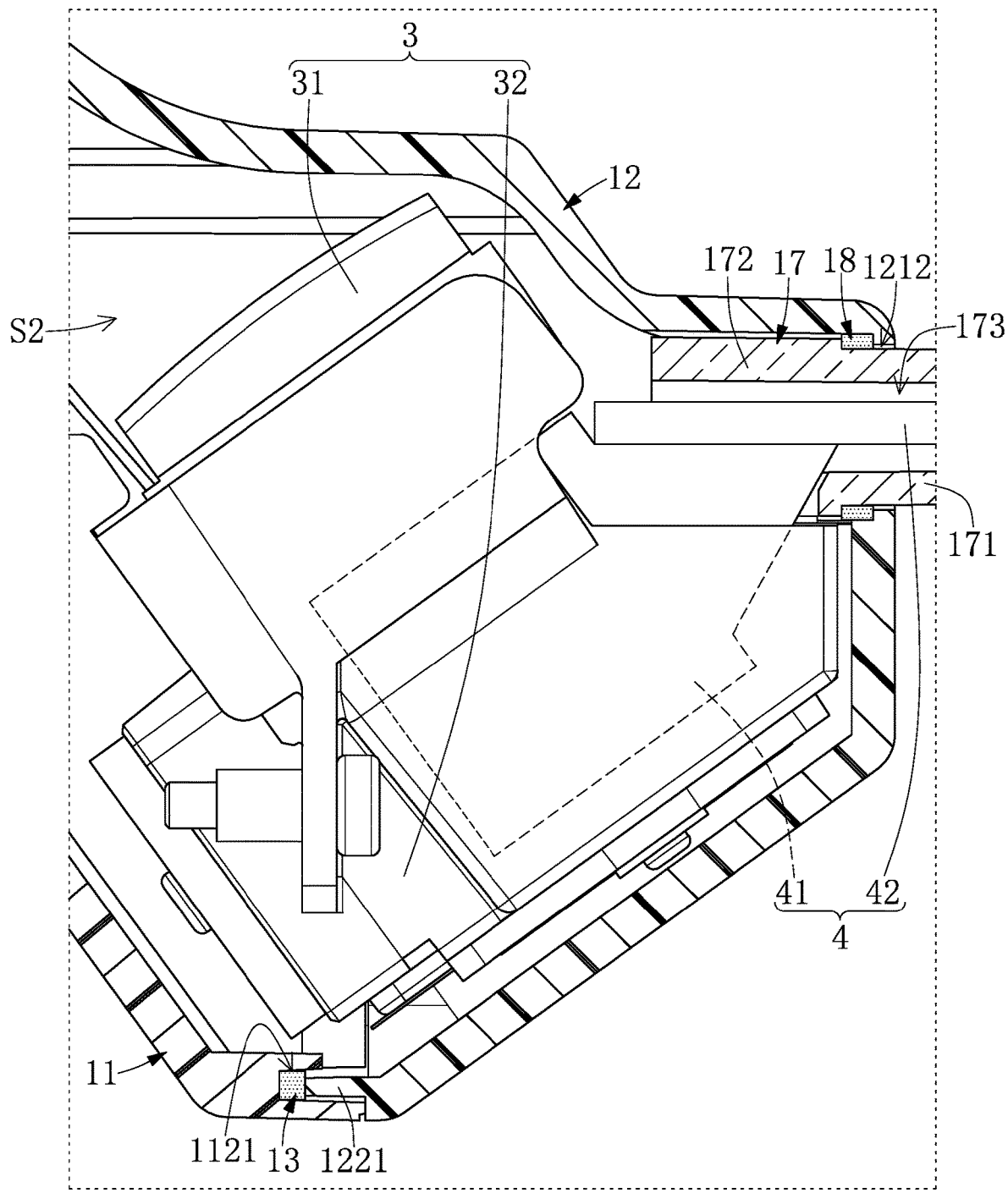
FIG. 8 is an enlarged view of part VIII of FIG. 6.

The first waterproof and dustproof gasket 13 has an enclosed loop-shape, the second cover 12 is detachably fastened to the first cover 11, and the first waterproof and dustproof gasket 13 is gaplessly sandwiched between and abutted against the first sealing edge portion 112 and the second sealing edge portion 122, so that the first cover 11, the second cover 12, and the first waterproof and dustproof gasket 13 jointly define an accommodating space S (as shown in FIG. 6 to FIG. 8) having an optical area S2 and a circuit area S1.

Specifically, two portions of the first cover 11 respectively corresponding in position to the optical area S2 and the circuit area S1 have an angle σ therebetween that is substantially within a range from 120 degrees to 150 degrees, thereby facilitating components in the sealing housing 1 to be properly arranged in a distribution suitable to a user. The fixing slots 1111 are located in the optical area S2 and the circuit area S1 (e.g., each corner of the accommodating space S is provided with one of the fixing slots 1111), the sealing seat 1112 is located in the optical area S2, and the circuit board 2 is located in the circuit area S1 of the accommodating space S.

Figure 9:
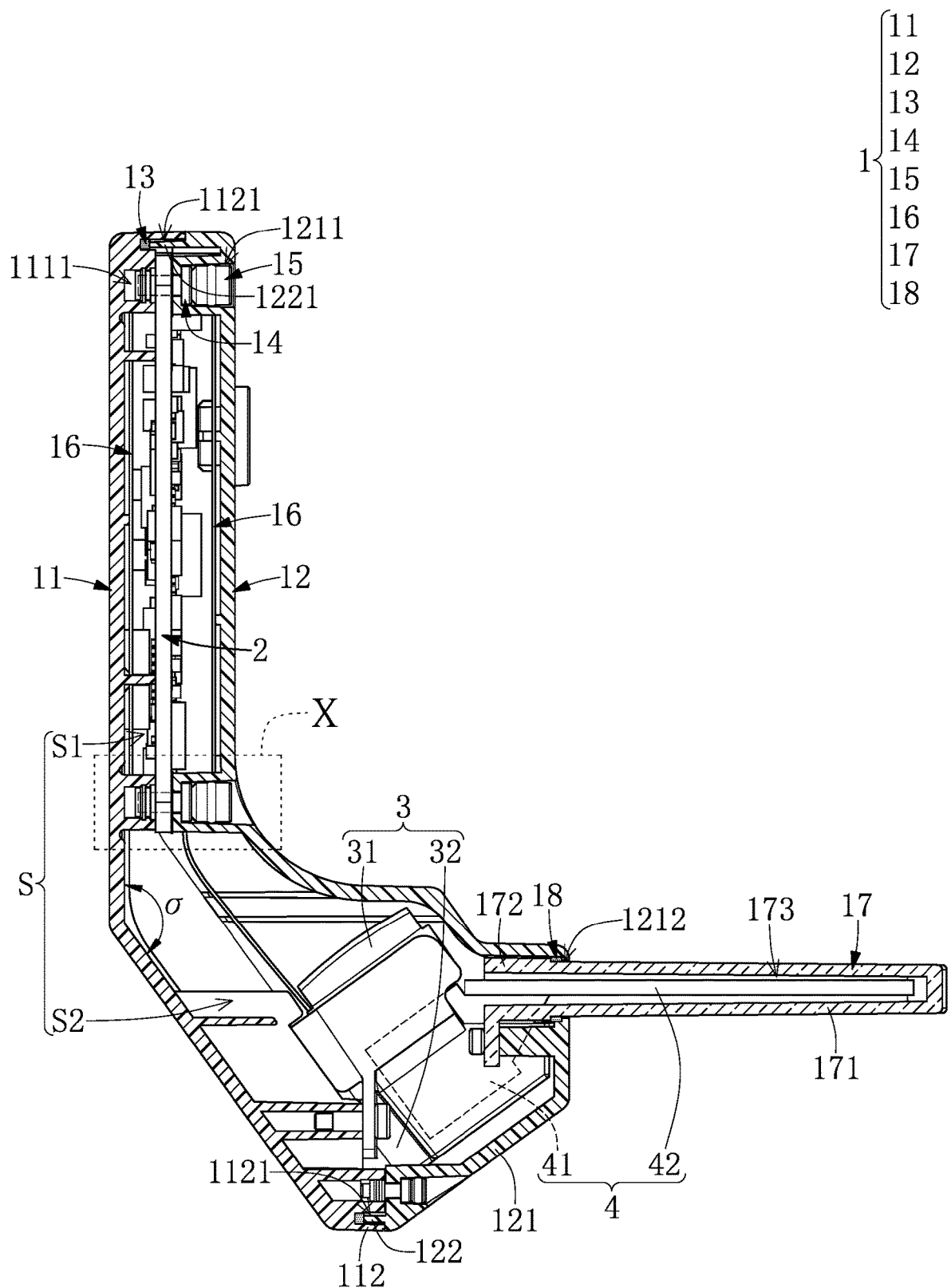
FIG. 9 is a cross-sectional view taken along line IX-IX of FIG. 2.
Figure 10:
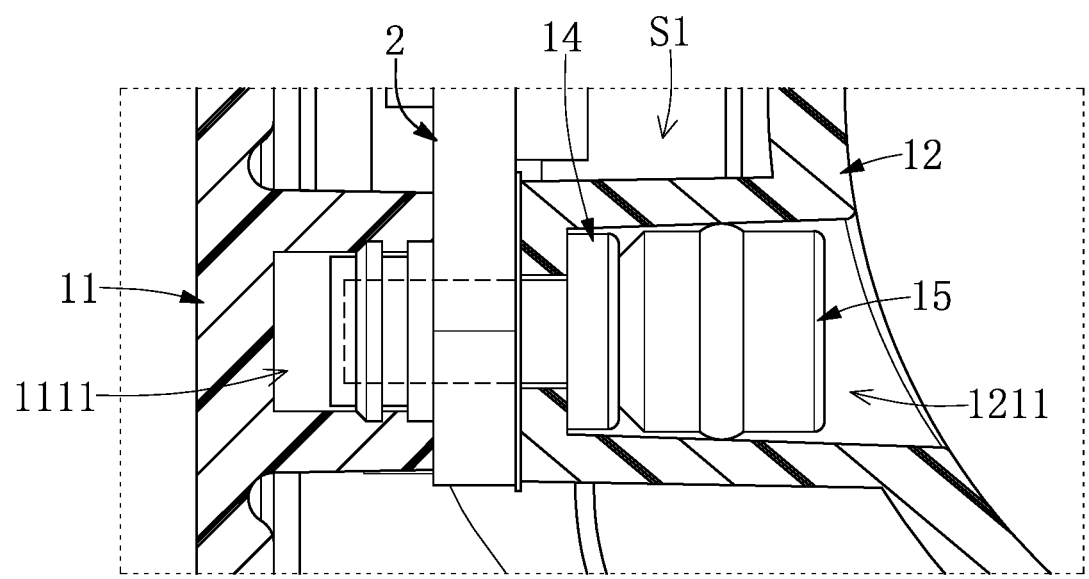
FIG. 10 is an enlarged view of part X of FIG. 9.

As shown in FIG. 9 and FIG. 10 of the present embodiment, the first cover 11 and the second cover 12 are assembled to each other through the fasteners 14, and the waterproof and dustproof plungers 15 are respectively cooperated with the fasteners 14 so as to effectively avoid mist or dust from permeating into the accommodating space S through any one of the fixing holes 1211. The fasteners 14 are respectively fastened to the fixing slots 1111 by respectively passing through the fixing holes 1211, so that the circuit board 2 is sandwiched between the first cover 11 and the second cover 12. Moreover, the waterproof and dustproof plungers 15 are respectively inserted into the fixing holes 1211 and are respectively abutted against the fasteners 14, and each of the waterproof and dustproof plungers 15 gaplessly abuts against an inner wall defining the corresponding fixing hole 1211, thereby ensuring that the accommodating space S cannot be in spatial communication with an external space through the fixing holes 1211.

In summary, the fasteners 14 can provide enough force to enable the first sealing edge portion 112 and the second sealing edge portion 122 to compress the first waterproof and dustproof gasket 13, thereby further ensuring that the accommodating space S cannot be in spatial communication with the external space through a junction between the first sealing edge portion 112 and the second sealing edge portion 122, but the present disclosure is not limited thereto. For example, in other embodiments of the present disclosure not shown in the drawings, the first cover 11 and the second cover 12 can be assembled to each other in other detachable manners.

In addition, in order to provide a better sealing effect through the first waterproof and dustproof gasket 13 sandwiched between the first sealing edge portion 112 and the second sealing edge portion 122, the first waterproof and dustproof gasket 13, the first sealing edge portion 112, and the second sealing edge portion 122 preferably meet at least part of the following conditions, but the present disclosure is not limited thereto.

Specifically, as shown in FIG. 4 to FIG. 6, the first sealing edge portion 112 has an annular groove 1121 and a plurality of retaining notches 1122 that are in spatial communication with the annular groove 1121. The second sealing edge portion 122 has an annular rib 1221 corresponding in shape to the annular groove 1121, and the first sealing edge portion 112 and the second sealing edge portion 122 jointly define at least one insertion opening O (as shown in FIG. 7).

The first waterproof and dustproof gasket 13 is disposed in the annular groove 1121 and is compressed by the annular rib 1221. The first waterproof and dustproof gasket 13 is integrally formed as a single one-piece structure having an elastic property. The first waterproof and dustproof gasket 13 has a strip portion 131, a plurality of block portions 132, and an annular pad 133. The strip portion 131 is substantially in a U-shape, the block portions 132 are connected to (an inner edge of) the strip portion 131 and respectively correspond in position to the retaining notches 1122, and the annular pad 133 is connected to two ends of the strip portion 131 so as to jointly form an enclosed loop-shape that corresponds in position to the annular groove 1121.

The strip portion 131 and the annular pad 133 of the first waterproof and dustproof gasket 13 are engaged in the annular groove 1121 of the first cover 11, and the block portions 132 are respectively engaged in the retaining notches 1122. The annular pad 133 corresponds in position to the at least one insertion opening O, so that an opening of at least one external connector 21 of the circuit board 2 can be in spatial communication with the at least one insertion opening O through the annular pad 133. Furthermore, the shape of the at least one insertion opening O and the type of the at least one external connector 21 can be changed or adjusted according to design requirements. For example, the shape of the at least one insertion opening O and the type of the at least one external connector 21 can be provided corresponding to Micro USB, Micro HDMI, or USB type-C.

In addition, the two EMI shielding layers 16 of the sealing housing 1 are located in the circuit area S1, and the two EMI shielding layers 16 are respectively located at two opposite sides of the circuit board 2 (e.g., the two EMI shielding layers 16 are respectively adhered to the first main body 111 and the second main body 121). In other words, the circuit board 2 is substantially located between the two EMI shielding layers 16.

The transparent case 17 is detachably assembled to the second cover 12 (by passing through the thru-hole 1212), and the transparent case 17 has an insertion slot 173 in spatial communication with the optical area S2. The second waterproof and dustproof gasket 18 is located in the optical area S2 and surrounds the thru-hole 1212, and the second waterproof and dustproof gasket 18 is gaplessly sandwiched between and abutted against the transparent case 17 and the second cover 12, so that the insertion slot 173 is in spatial communication with only the accommodating space S.

Specifically, the transparent housing 17 in the present embodiment has a transparent display region 171 and an annular abutted region 172 that is connected to a peripheral edge of the transparent display region 171 so as to form an opening of the insertion slot 173. In other words, the insertion slot 173 is recessed from the annular abutted region 172 toward the transparent display region 171.

Moreover, the transparent display region 171 has a hollow structure and is located outside of the second cover 12 by passing through the thru-hole 1212, and the annular abutted region 172 is located inside of and threaded to the second cover 12, so that the second waterproof and dustproof gasket 18 is gaplessly sandwiched between and abutted against the annular abutted region 172 and the second cover 12, thereby effectively preventing mist or dust from permeating into the accommodating space S of the sealing housing 1 through the thru-hole 1212.

The optical engine 3 in the present embodiment is a liquid crystal on silicon (LCoS) mechanism, but the present disclosure is not limited thereto. The optical engine 3 includes a light source module 31 and an image formation module 32 that is optically coupled to the light source module 31. In the present embodiment, the light source module 31 can be a plurality of light emitting diode (LED) emitters, the image formation module 32 can be a Micro Electro Mechanical Systems (MEMS) module, and the LOE 4 includes a transmission portion 41 assembled to the image formation module 32 and a display board 42 that is connected to the transmission portion 41, but the present disclosure is not limited thereto.

Specifically, the optical engine 3 is detachably fastened to the first cover 11 and is located in the optical area S2 of the accommodating space S, and the optical engine 3 is electrically coupled to the circuit board 2 (e.g., the optical engine 3 is connected to at least one internal connector 22 of the circuit board 2 through a cable). In the present embodiment, the optical engine 3 is detachably threaded to the assembling seat 1112, and the LOE 4 (e.g., the display board 42) is inserted into the insertion slot 173 of the transparent case 17, so that a normal vector of the display board 42 is orthogonal to a normal vector of the circuit board 2. Accordingly, the display board 42 and the circuit board 2 can be arranged in a distribution suitable to a user.

In summary, through the structural arrangement of the sealing housing 1 of the detachable projection device 100 provided by the present embodiment, the components in the sealing housing 1 can be easily detached to be replaced or repaired under the premise of meeting a waterproof and dustproof requirement, thereby effectively reducing cost of the detachable projection device 100 and facilitating the detachable projection device 100 to be popularized.

It should be noted that the sealing housing 1 in the present embodiment is in cooperation with the optical engine 3, the LOE 4, and the circuit board 2, but the present disclosure is not limited thereto. For example, in other embodiments of the present disclosure not shown in the drawings, the sealing housing 1 can be independently used (e.g., sold) or can be used in cooperation with other devices.

In addition, as shown in FIG. 1 to FIG. 3 and FIG. 6, in order to enable the detachable projection device 100 to stably and quickly assemble to the wearable device 200, the detachable projection device 100 further includes a movable frame 5 and at least one cable connector 6. The movable frame 5 is detachably assembled to the second cover 12 of the sealing housing 1, so that the detachable projection device 100 can be assembled to the wearable device 200 through the movable frame 5. The at least one cable connector 6 is detachably inserted into the at least one external connector 21 of the circuit board 2 and is electrically coupled to the wearable device 200.

Specifically, the wearable device 200 in the present embodiment includes a wearable member 202 (e.g., a hat) configured to be worn on the head of a user, a carrying frame 203 fixed to the wearable member 202, and a communication device 204 (e.g., any one of a mobile phone, a tablet, and a laptop having an iOS system or an Android system) that is detachably assembled to the carrying frame 203. The movable frame 5 is assembled to the wearable member 202, and two ends of the at least one cable connector 6 are respectively inserted into the at least one external connector 21 and the communication device 204, so that the detachable projection device 100 is electrically coupled to the communication device 204.

It should be noted that the battery 201 in the present embodiment is built in the communication device 204, but the present disclosure is not limited thereto. For example, in other embodiments of the present disclosure not shown in the drawings, the battery 201 can be an independent component arranged outside of the communication device 204 (e.g., the battery 201 is assembled to the movable frame 5 or the carrying frame 203).

In addition, the detachable projection device 100 has a structural design suitable for a single eye and can be flexibly adjusted according to different usage requirements. For example, the detachable projection device 100 can be applied to a user's left eye or right eye by being cooperated with the wearable device 200.

In summary, the detachable projection device 100 in the present embodiment is a firm structure having no button and connected to the communication device 204 (e.g., a mobile phone, a tablet, or a laptop), thereby providing a user to be able to conveniently carry the detachable projection device 100 and to manipulate the detachable projection device 100 through the familiar communication device 204. Moreover, in the present embodiment, when the detachable projection device 100 is worn on a user, the user can obtain a support or an instruction from other remote personnel (e.g., a customer or a maintenance personnel) for directly repairing or correspondingly acting in a hands-free manner.

Second Embodiment

Figure 11:
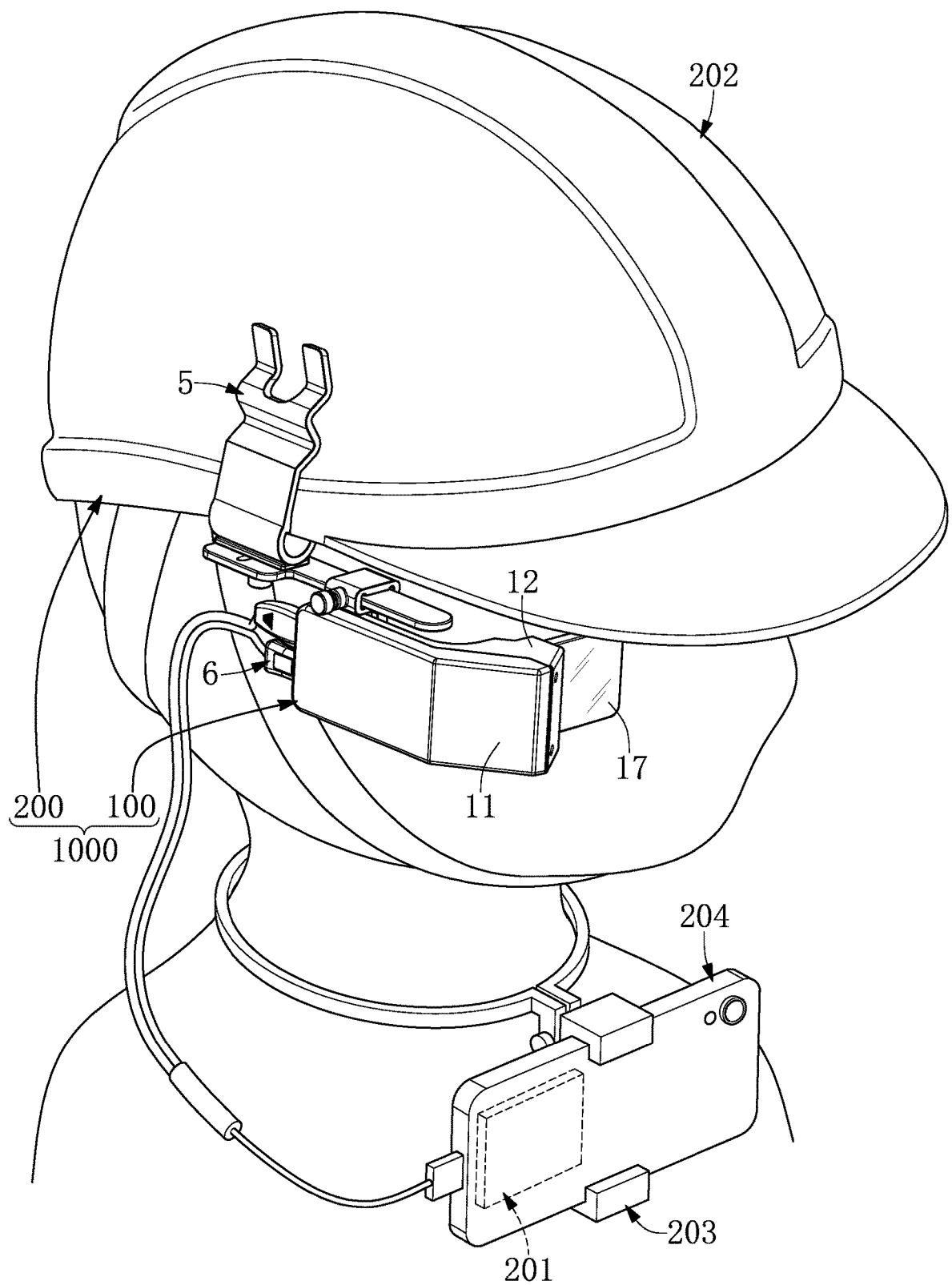
FIG. 11 is a schematic usage view of the wearable apparatus according to a second embodiment of the present disclosure.

Referring to FIG. 11, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the wearable device 200 in the present embodiment includes a wearable member 202 (e.g., a hat) configured to be worn on the head of a user, a carrying frame 203 worn on the neck of a user, and a communication device 204 (e.g., any one of a mobile phone, a tablet, and a laptop having an iOS system or an Android system) that is detachably assembled to the carrying frame 203. The communication device 204 is disposed on (or hung over) a user's chest by being assembled to the carrying frame 203.

Moreover, the movable frame 5 is assembled to the wearable member 202, so that the detachable projection device 100 can be assembled to the wearable member 202 of the wearable device 200 through the movable frame 5. Two ends of the at least one cable connector 6 are respectively inserted into the detachable projection device 100 (e.g., the at least one external connector) and the communication device 204, so that the detachable projection device 100 can be electrically coupled to the communication device 204.

Third Embodiment

Figure 12:
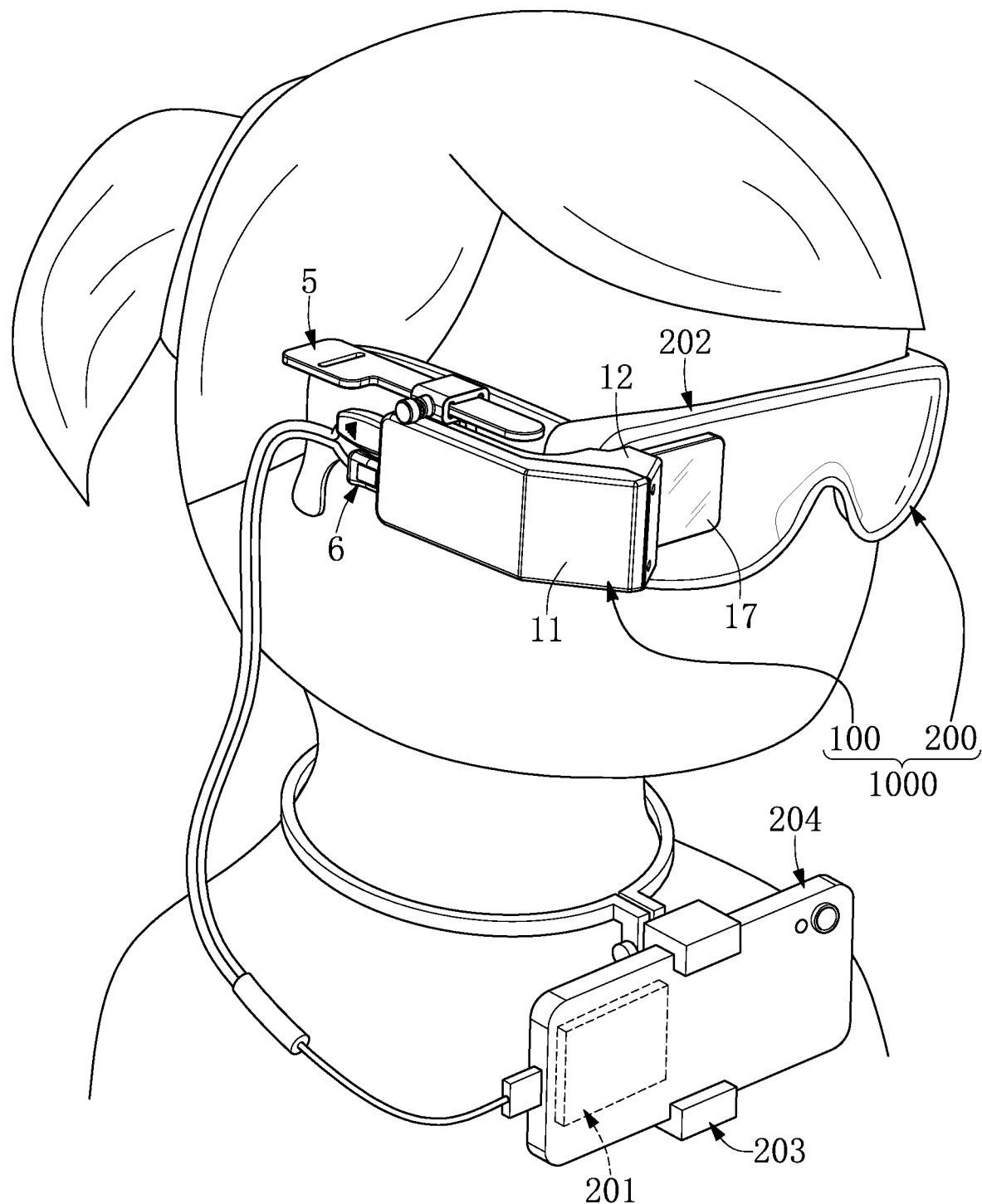
FIG. 12 is a schematic usage view of the wearable apparatus according to a third embodiment of the present disclosure.

Referring to FIG. 12, a third embodiment of the present disclosure, which is similar to the first embodiment of the present disclosure, is provided. For the sake of brevity, descriptions of the same components in the first and third embodiments of the present disclosure will be omitted herein, and the following description only discloses different features between the first and third embodiments.

In the present embodiment, the wearable device 200 in the present embodiment includes a wearable member 202 (e.g., a goggle) configured to be worn on the head of a user, a carrying frame 203 worn on the neck of a user, and a communication device 204 (e.g., any one of a mobile phone, a tablet, and a laptop having an iOS system or an Android system) that is detachably assembled to the carrying frame 203. The communication device 204 is disposed on (or hung over) a user's chest by being assembled to the carrying frame 203.

Moreover, the movable frame 5 is assembled to the wearable member 202, so that the detachable projection device 100 can be assembled to the wearable member 202 of the wearable device 200 through the movable frame 5. Two ends of the at least one cable connector 6 are respectively inserted into the detachable projection device 100 (e.g., the at least one external connector) and the communication device 204, so that the detachable projection device 100 can be electrically coupled to the communication device 204.

Beneficial Effects of the Embodiments

In conclusion, through the structural arrangement of the sealing housing (of the detachable projection device or the wearable apparatus) provided by the present disclosure, the components in the sealing housing can be easily detached to be replaced or repaired under the premise of meeting a waterproof and dustproof requirement, thereby effectively reducing cost of the detachable projection device and facilitating the detachable projection device to be popularized.

Moreover, through the structural arrangement of the sealing housing (of the detachable projection device or the wearable apparatus) provided by the present disclosure (e.g., the optical engine is detachably threaded to the assembling seat, so that the normal vector of the display board is orthogonal to the normal vector of the circuit board), the components in the sealing housing can be properly arranged in a distribution suitable to a user.

In addition, the detachable projection device of the present disclosure can further have the movable frame that is disposed on the second cover and that can be assembled to the wearable device, thereby allowing the detachable projection device to be stably and quickly assembled to the wearable device. In addition, the detachable projection device of the present disclosure has a structural design suitable for a single eye and can be manipulated simply, thereby easily introducing the business-to-business (B2B) mode.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wearable apparatus, comprising:
a detachable projection device including:
a sealing housing including:
a first cover having a first sealing edge portion;
a second cover having a second sealing edge portion corresponding in shape to the first sealing edge portion;
a first waterproof and dustproof gasket having an enclosed loop-shape, wherein the second cover is detachably fastened to the first cover, and the first waterproof and dustproof gasket is gaplessly sandwiched between and abutted against the first sealing edge portion and the second sealing edge portion, so that the first cover, the second cover, and the first waterproof and dustproof gasket jointly define an accommodating space having an optical area and a circuit area; and
a transparent case detachably assembled to the second cover and having an insertion slot that is in spatial communication with the optical area of the accommodating space;
an optical engine detachably fastened to the first cover and located in the optical area of the accommodating space, wherein the optical engine includes a light source module and an image formation module that is optically coupled to the light source;
a light-guide optical element (LOE) assembled to the image formation module and inserted into the insertion slot of the transparent case; and
a circuit board located in the circuit area of the accommodating space and electrically coupled to the optical engine; and
a wearable device having a battery disposed therein, wherein the detachable projection device is detachably fastened to the wearable device and is electrically coupled to the battery.

2. The wearable apparatus according to claim 1, wherein the detachable projection device includes:
a movable frame detachably assembled to the second cover of the sealing housing, wherein the detachable projection device is assembled to the wearable device through the movable frame; and
at least one cable connector detachably inserted into at least one external connector of the circuit board and electrically coupled to the wearable device.

3. The wearable apparatus according to claim 2, wherein the wearable device includes:
a wearable member configured to be worn on the head of a user, wherein the movable frame is assembled to the wearable member;
a carrying frame fixed to the wearable member or worn on the neck of a user; and
a communication device having the battery disposed therein and detachably assembled to the carrying frame;
wherein two ends of the at least one cable connector are respectively inserted into the at least one external connector and the communication device, so that the detachable projection device is electrically coupled to the communication device.

4. A detachable projection device, comprising:
a sealing housing including:
a first cover having a first sealing edge portion;
a second cover having a second sealing edge portion corresponding in shape to the first sealing edge portion;
a first waterproof and dustproof gasket having an enclosed loop-shape, wherein the second cover is detachably fastened to the first cover, and the first waterproof and dustproof gasket is gaplessly sandwiched between and abutted against the first sealing edge portion and the second sealing edge portion, so that the first cover, the second cover, and the first waterproof and dustproof gasket jointly define an accommodating space having an optical area and a circuit area; and a transparent case connected to the second cover and having an insertion slot that is in spatial communication with the optical area of the accommodating space;
an optical engine detachably fastened to the first cover and located in the optical area of the accommodating space, wherein the optical engine includes a light source module and an image formation module that is optically coupled to the light source;
a light-guide optical element (LOE) assembled to the image formation module and inserted into the insertion slot of the transparent case; and
a circuit board located in the circuit area of the accommodating space and electrically coupled to the optical engine.

5. The detachable projection device according to claim 4, wherein the sealing housing further includes a second waterproof and dustproof gasket, and the second waterproof and dustproof gasket is gaplessly sandwiched between and abutted against the transparent case and the second cover, so that the insertion slot is in spatial communication with only the accommodating space.

6. The detachable projection device according to claim 5, wherein the second cover has a thru-hole, and the transparent case includes:
a transparent display region located outside of the second cover by passing through the thru-hole; and
an annular abutted region that is connected to a peripheral edge of the transparent display region so as to form an opening of the insertion slot, wherein the annular abutted region is located inside of and threaded to the second cover, so that the second waterproof and dustproof gasket is gaplessly sandwiched between and abutted against the annular abutted region and the second cover.

7. The detachable projection device according to claim 4, wherein the first sealing edge portion has an annular groove, the second sealing edge portion has an annular rib corresponding in shape to the annular groove, and the first waterproof and dustproof gasket is disposed in the annular groove and is compressed by the annular rib.

8. The detachable projection device according to claim 7, wherein the first sealing edge portion and the second sealing edge portion jointly define at least one insertion opening, and the first waterproof and dustproof gasket has a strip portion and an annular pad, and wherein the annular pad is connected to two ends of the strip portion so as to jointly form an enclosed loop-shape, the strip portion and the annular pad are engaged in the annular groove, and an opening of at least one external connector of the circuit board is in spatial communication with the at least one insertion opening through the annular pad.

9. The detachable projection device according to claim 8, wherein the first sealing edge portion has a plurality of retaining notches in spatial communication with the annular groove, and the first waterproof and dustproof gasket has a plurality of block portions that are connected to the strip portion and that are respectively engaged in the retaining notches.

10. The detachable projection device according to claim 4, wherein the first cover has an assembling seat formed on an inner surface thereof and located in the optical area, and the LOE includes a transmission portion assembled to the image formation module and a display board that is connected to the transmission portion, and wherein the optical engine is detachably threaded to the assembling seat, so that a normal vector of the display board is orthogonal to a normal vector of the circuit board.

11. The detachable projection device according to claim 4, wherein the first cover has a plurality of fixing slots formed on an inner surface thereof and located in the optical area and the circuit area, and the second cover has a plurality of fixing holes respectively corresponding in position to the fixing slots, and wherein the sealing housing includes:
a plurality of fasteners that are respectively fastened to the fixing slots by respectively passing through the fixing holes, so that the circuit board is sandwiched between the first cover and the second cover; and
a plurality of waterproof and dustproof plungers respectively inserted into the fixing holes and respectively abutted against the fasteners, wherein each of the waterproof and dustproof plungers gaplessly abuts against an inner wall defining the corresponding fixing hole.

12. The detachable projection device according to claim 4, wherein the sealing housing includes two electromagnetic interference (EMI) shielding layers respectively located at two opposite sides of the circuit board.

13. A sealing housing of a detachable projection device, comprising:
a first cover having a first sealing edge portion;
a second cover having a second sealing edge portion corresponding in shape to the first sealing edge portion;
a first waterproof and dustproof gasket having an enclosed loop-shape, wherein the second cover is detachably fastened to the first cover, and the first waterproof and dustproof gasket is gaplessly sandwiched between and abutted against the first sealing edge portion and the second sealing edge portion, so that the first cover, the second cover, and the first waterproof and dustproof gasket jointly define an accommodating space having an optical area and a circuit area; and
a transparent case connected to the second cover and having an insertion slot that is in spatial communication with the optical area of the accommodating space.

14. The sealing housing according to claim 13, further comprising a second waterproof and dustproof gasket, wherein the second cover has a thru-hole, and the transparent case includes:
a transparent display region located outside of the second cover by passing through the thru-hole; and
an annular abutted region connected to a peripheral edge of the transparent display region so as to form an opening of the insertion slot, wherein the annular abutted region is located inside of and threaded to the second cover, so that the second waterproof and dustproof gasket is gaplessly sandwiched between and abutted against the annular abutted region and the second cover, and the insertion slot is in spatial communication with only the accommodating space.

15. The sealing housing according to claim 13, wherein the first cover has a plurality of fixing slots formed on an inner surface thereof and located in the optical area and the circuit area, and the second cover has a plurality of fixing holes respectively corresponding in position to the fixing slots, and wherein the sealing housing includes:
a plurality of fasteners that are respectively fastened to the fixing slots by respectively passing through the fixing holes, so that the circuit board is sandwiched between the first cover and the second cover; and
a plurality of waterproof and dustproof plungers respectively inserted into the fixing holes and respectively abutted against the fasteners, wherein each of the waterproof and dustproof plungers gaplessly abuts against an inner wall defining the corresponding fixing hole.

\* \* \* \* \*